United States Patent
Ng et al.

(10) Patent No.: US 6,756,600 B2
(45) Date of Patent: *Jun. 29, 2004

(54) ION IMPLANTATION WITH IMPROVED ION SOURCE LIFE EXPECTANCY

(75) Inventors: Che-Hoo Ng, San Martin, CA (US); Emi Ishida, Sunnyvale, CA (US); Jaime M. Reyes, Beverly, MA (US); Jinning Liu, Danvers, MA (US); Sandeep Mehta, Berverly, MA (US)

(73) Assignees: Advanced Micro Devices, Inc., Sunnyvale, CA (US); Varian Associates, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 11 days.

(21) Appl. No.: 09/252,845

(22) Filed: Feb. 19, 1999

(65) Prior Publication Data

US 2002/0000523 A1 Jan. 3, 2002

(51) Int. Cl.[7] .................................................. H01J 37/08
(52) U.S. Cl. .................................................. 250/492.21
(58) Field of Search ..................................... 250/492.21

(56) References Cited

U.S. PATENT DOCUMENTS

| | | | |
|---|---|---|---|
| 5,262,652 A | * 11/1993 | Bright et al. | ............. 250/492.2 |
| 5,962,858 A | * 10/1999 | Gwinn | ................... 250/492.21 |
| 5,977,552 A | * 11/1999 | Foad | ..................... 250/492.21 |

* cited by examiner

*Primary Examiner*—Jack Berman
(74) *Attorney, Agent, or Firm*—Mikio Ishimaru

(57) ABSTRACT

A method of increasing ion source lifetime in an ion implantation system uses the introduction of an inert gas, such as argon or xenon, into the halide-containing source gas. Inert gas constituents have a cleansing effect in the plasma ambient by enhancing sputtering.

22 Claims, 1 Drawing Sheet

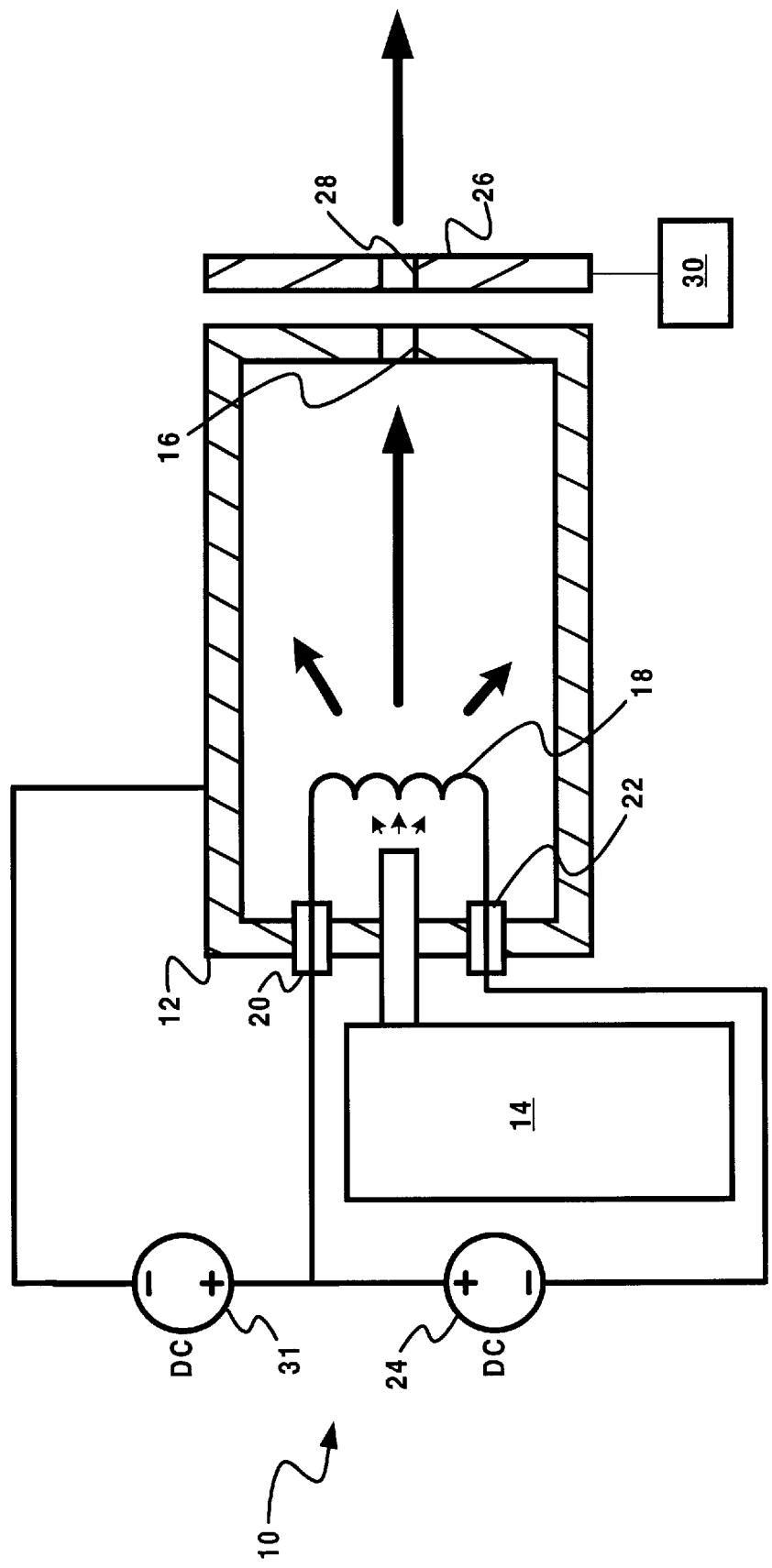

ION IMPLANTATION WITH IMPROVED ION SOURCE LIFE EXPECTANCY

TECHNICAL FIELD

The present invention relates generally to ion implantation and more particularly to improving the life expectancy of ion implantation sources.

BACKGROUND ART

Ion implantation is used in integrated circuit fabrication to introduce controlled amounts of dopants into semiconductors. Doping is accomplished by scanning a beam of dopant ions across a semiconductor wafer. Ions created at an ion source are accelerated through apertures, various electric fields, and a mass-selecting magnet, before being implanted in the semiconductor silicon wafer.

The ion source of an ion implantation system generates ions by introducing electrons into a chamber filled with dopant gas. The electrons are generated by thermionic emission from a resistively-heated filament. Collisions of these electrons with dopant atoms and molecules in the gas result in the creation of an ionized plasma consisting of positive and negative dopant ions. An extraction plate with a negative or positive bias will respectively allow the positive and negative ions to pass through the aperture and out of the ion source as an ion beam.

One major failure mode of ion implantation systems using halide containing source gases is that the breakup product is a dihalide which condenses onto cold surfaces as a sticky, conductive residue. This residue forms on the high voltage components of the ion implanter and causes electrical short circuits in the ion source, which can extinguish the arc required to produce thermionic electrons.

For example, with a germanium implant species, Ge+, one example of an ion source material is germanium tetrafluoride ($GeF_4$) gas. In addition to ionization, the energetic electrons formed by thermionic emission break up the $GeF_4$ molecule into several constituents: germanium difluoride ($GeF_2$), elemental (Ge), and elemental (F). The $GeF_2$ is a sticky, conductive material. Boron trifluoride ($BF_3$) and silicon tetrafluoride ($SiF_4$) are source gases which are also subject to the same problem as $GeF_4$, although to a lesser degree.

A second major failure mode is that the physical and chemical sputtering by halide containing plasma deposits sputtered materials from the arc-chamber walls to the filament, thus coating it and preventing thermionic emission.

A third major cause of failure of ion implantation systems is that the reactive halide gas causes thinning of the filament which leads to filament failures.

Finally, the thinning and coating occur non-uniformly along the filament, resulting in stresses which eventually break the filament. Thinning occurs via both physical sputtering and chemical etching of the filament material, since fluorine is constituent.

Thus, there are four major failure modes for ion implantation systems using halide containing source materials. While the ion source life expectancy for ion implantation systems using non-halide containing source materials is generally around 168 hours, with halide-containing materials, such as $GeF_4$, the ion source life is often as low as 10 hours.

Experts in the field of ion implantation have been consulted in an attempt to increase the mean time between failures (MTBF), or life expectancy of an ion source, but none of the experts has been able to provide a satisfactory solution which would significantly increase the source life time.

DISCLOSURE OF THE INVENTION

The present invention provides a method of increasing the ion source lifetime by infusing the source gas, such as germanium tetrafluoride, with an inert gas, such as argon or xenon. The gas mixture causes inert gas sputtering, which has a cleansing effect inside the plasma ambient. Among other advantages, the invention 1) reduces residue build-up, which causes electrical short circuits to the filament, thereby extinguishing the arc required to produce ions, 2) enhances filament thinning by physical inert gas ion sputtering to counteract the coating failure mechanism, 3) dilutes the ion plasma of reactive halide species in order to reduce the thinning failure mechanism, and 4) reduces stress failures in the filament due to non-uniform thinning and coating.

The present invention further provides a built-in cleansing of the ion implantation arc chamber.

The present invention further provides an optimization of existing ion implanters to generate ions from halide compounds without requiring expensive or esoteric equipment modifications or upgrades.

The above and additional advantages of the present invention will become apparent to those skilled in the art from a reading of the following detailed description when taken in conjunction with the accompanying drawings.

BRIEF DESCRIPTION OF THE DRAWINGS

The FIGURE is a schematic illustration of an ion implantation system using the present invention.

BEST MODE FOR CARRYING OUT THE INVENTION

Referring now to the FIGURE, therein is shown an ion source 10 which is a part of a conventional ion implantation system (not shown).

The ion source 10 consists of an arc chamber 12 connected to a gas source 14 and having an opening 16 provided in the wall of the arc chamber 12.

The arc chamber 12 contains a vacuum and a filament 18, generally made of tungsten. The filament 18 is connected through insulators 20 and 22 in the wall of the arc chamber 12 to a power supply 24. The power supply 24 supplies sufficient power to heat the filament 18 to the level required for the particular ion filament. In the preferred embodiment, current is supplied in the range up to 400 A.

An electrical discharge or an arc is established between the filament 18 and the arc chamber 12 by the application of electrical power from an arc power supply 31. The arc discharge increases the ionization of the gas and charges the ions in the gas from the gas source 14. As would be evident to those skilled in the art, the arc may be produced by the application of negative bias from the arc power supply 31 to the filament 18. In the preferred mode, the electrical bias potential to produce and sustain the arc is in the range of 30 to 150 volts.

Outside the opening 16 is an ion extraction plate 26 having an aperture 28 provided therein. The extraction plate 26 is connected to a high potential source 30. It would be understood by those skilled in the art that, depending on the positive or negative charge of the ions from the arc chamber 12, the high potential source 30 will provide a positive or negative bias to the extraction plate 26. In the preferred embodiment where positive charged particles are being provided, the high potential source 30 will provide a negative bias to allow control of the positive ions.

In operation in the best mode, the ion source 10 will be providing ions, such as germanium ions, as shown by the arrows. In this situation, the gas source 14 will provide a mixture of between 20% and 95% of the halide compound dopant species by volume. The balance of the mixture is an inert gas or a combination of inert gases and other gases. The inert gas preferably would be a Group VIII A gas, such as argon or xenon. In the best mode, it is desired that the wafer out of the ion implantation system will be impacted by between $1 \times 10^{13}$ to $5 \times 10^{15}$ dopant ions per square centimeter.

The power supply 24 will heat the filament 18 to cause thermionic emission of electrons and to convert both the inert gas and the halide compound into ionized plasma. The ionized plasma, in part, will be directed through the opening 16 and controlled going through the aperture 28 of the extraction plate 26.

The negative bias of the filament 18 controlled by the arc power supply 31 will direct ions of the inert gas back to the filament 18 to sputter the filament 18 of build-up due to tungsten being eroded by sputtering from the walls of the arc chamber 12. This can be done in such a way that the areas of the filament 18, which are prone to thinning, can be built up by the inert gas ions causing sputtering of the inside of the arc chamber 12 which is of the same material as the filament 18. At the same time, other inert gas ions will be directed to the insulators 22 and 24 to scrub them of the dopant species dihalide which is a sticky and conductive residue.

The gas source 14 can provide any of a number of halide compound implantation source gases such as germanium tetrafluoride ($GeF_4$), boron trifluoride ($BF_3$), and silicon tetrafluoride ($SiF_4$). In the best mode, the gas source 14 provides germanium tretrafluoride which provides germanium (Ge) as the dopant species.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. For an ion implantation system, an ion source comprising:
   a gas source for providing a source gas containing an ion implantation dopant gas and an inert gas;
   an electron source surroundable by said source gas and subject to coating by a non-dopant component of said source gas;
   a source of electrical power connectable to said electron source to cause said electron source to create charged ions in said source gas to form a charged plasma and to bias said electron source to cause cleansing of said non-dopant component of said source gas by inert gas ion sputtering of said electron source; and
   an ion extraction system for controlling charged ions from said charged plasma.

2. The ion source as claimed in claim 1 wherein the source gas is a halide containing source gas.

3. The ion source as claimed in claim 1 wherein said inert gas is selected from the group containing Group VIII A gases.

4. The ion source as claimed in claim 1 wherein said inert gas is approximately between 5% and 80% by volume of the mixture of said source gas and said inert gas.

5. The ion source as claimed in claim 1 wherein said extraction system is configured to redirect ions from said inert gas back to clean said electron source.

6. The ion source as claimed in claim 1 wherein said electron source is capable of implanting between $1 \times 10^{13}$ to $5 \times 10^{15}$ ions per square centimeter at a semiconductor wafer.

7. The ion source as claimed in claim 1 including an arc chamber disposed around said electron source containing material capable of replenishing said electron source.

8. The ion source as claimed in claim 1 wherein said electron source is capable of creating said charged ions by thermionic emission.

9. The ion source as claimed in claim 1 including an arc chamber containing said electron source and made of similar material thereto, and wherein said inert gas sputters said arc chamber to cause said chamber material to form on said electron source.

10. The ion source as claimed in claim 9 wherein the potential between said electron source and said arc chamber is about 30 to 150 volts.

11. For an ion implantation system, an ion source comprising:
    a housing;
    a gas source for providing a source gas containing an ion implantation dopant gas and an inert gas into said housing;
    a filament in said housing subject to coating by a non-dopant component of said source gas;
    a source of electrical power connected to said housing and connectible to said filament to cause said filament to create charged ions in said gas source to form a charged plasma and to bias said filament from said housing to the filament to cause cleansing of said non-dopant component of said source gas by inert gas ion sputtering of said filament; and
    an ion extraction system for controlling charged ions from said charged plasma.

12. The ion source as claimed in claim 11 wherein the source gas is selected from a group containing germanium tetrafluoride (GeF$_4$), boron trifluoride (BF$_3$), and silicon tetrafluoride (SiF$_4$).

13. The ion source as claimed in claim 11 wherein said inert gas is selected from the group containing argon and xenon.

14. The ion source as claimed in claim 11 wherein said source gas is a mixture of said ion implantation dopant gas, said inert gas and a third gas.

15. The ion source as claimed in claim 11 wherein said extraction system is configured to redirect ions from said inert gas back to clean said electron source.

16. The ion source as claimed in claim 11 wherein said electron source is capable of providing between $1 \times 10^{13}$ to $5 \times 10^{15}$ ions per square centimeter at a semiconductor wafer.

17. The ion source as claimed in claim 11 including an arc chamber containing said filament and a material capable of replenishing said filament.

18. The ion source as claimed in claim 11 wherein said electron source is capable of creating said charged plasma by thermionic emission.

19. The ion source as claimed in claim 11 including an arc chamber containing said electron source and made of similar material thereto, and wherein said inert gas sputters said chamber to cause said chamber material to form on said filament.

20. The ion source as claimed in claim 19 wherein the potential between said electron source and said arc chamber is between 30 to 150 volts.

21. The ion source as claimed in claim 1 wherein:

said charged ions have a positive charge; and said source of electrical power negatively biases said electron source.

22. The ion source as claimed in claim 11 wherein:

said charged ions have a positive charge; and said source of electrical power negatively biases said filament from said housing.

* * * * *

UNITED STATES PATENT AND TRADEMARK OFFICE
CERTIFICATE OF CORRECTION

PATENT NO. : 6,756,600 B2
DATED : June 29, 2004
INVENTOR(S) : Ng et al.

It is certified that error appears in the above-identified patent and that said Letters Patent is hereby corrected as shown below:

Title page,
Item [*] Notice, delete "11 days." and insert therefor -- 762 days. --

Signed and Sealed this

Twenty-first Day of December, 2004

JON W. DUDAS
*Director of the United States Patent and Trademark Office*